United States Patent [19]

Lauffer et al.

[11] Patent Number: 5,059,835
[45] Date of Patent: Oct. 22, 1991

[54] CMOS CIRCUIT WITH PROGRAMMABLE INPUT THRESHOLD

[75] Inventors: Donald K. Lauffer, Poway; Ikuo J. Sanwo, San Marcos, both of Calif.

[73] Assignee: NCR Corporation, Dayton, Ohio

[21] Appl. No.: 57,416

[22] Filed: Jun. 4, 1987

[51] Int. Cl.[5] .................. H01H 37/76; H03K 19/094
[52] U.S. Cl. .................. 307/576; 307/202.1; 307/451; 307/469; 307/464; 307/475
[58] Field of Search ............. 307/475, 451, 463, 464, 307/465, 468, 469, 576, 579, 585

[56] References Cited

U.S. PATENT DOCUMENTS

| | | | |
|---|---|---|---|
| Re. 32,515 | 10/1987 | Shoji | 307/452 |
| 3,691,401 | 9/1972 | Forlani et al. | 307/468 |
| 3,900,742 | 8/1975 | Hampel et al. | 307/464 |
| 4,016,434 | 4/1977 | DeFilippi | 307/304 |
| 4,217,502 | 8/1980 | Suzuki et al. | 307/475 |
| 4,242,604 | 12/1980 | Smith | 307/464 |
| 4,438,352 | 3/1984 | Mardkha | 307/475 |
| 4,471,242 | 9/1984 | Noufer et al. | 307/475 |
| 4,495,427 | 1/1985 | Cartwright, Jr. | 307/451 X |
| 4,518,873 | 5/1985 | Suzuki et al. | 307/475 |
| 4,533,841 | 8/1985 | Konishi | 307/471 |
| 4,555,642 | 11/1985 | Morales | 307/475 |
| 4,578,600 | 3/1986 | Magee | 307/451 |
| 4,584,491 | 4/1986 | Ulmer | 307/475 |
| 4,590,388 | 5/1986 | Clemons et al. | 307/469 |
| 4,593,212 | 6/1986 | Svager | 307/475 |
| 4,595,845 | 6/1986 | Briggs | 307/579 |
| 4,609,830 | 9/1986 | Brandman | 307/469 |
| 4,639,615 | 1/1987 | Lee et al. | 307/202.1 X |

FOREIGN PATENT DOCUMENTS 0253914 1/1988 European Pat. Off. .
57-10533 5/1982 Japan .
60-30216 6/1985 Japan .
61-112424 11/1986 Japan .

OTHER PUBLICATIONS

Electronic Design, vol. 34, No. 4, Feb. 20, 1986 (Hasbrouck Heights, N.J. U.S.) D. Bursky: "CMOS Array Doffs I/O Cells, puts 36,000 Gates on Chip", pp. 38–39.

Primary Examiner—Timothy P. Callahan
Attorney, Agent, or Firm—Stephen F. Jewett; Edward Dugas

[57] ABSTRACT

A CMOS circuit having an input threshold, the CMOS circuit including a first field-effect transistor having a source connected to a first power supply terminal, a drain connected to an output terminal, a gate connected to an input terminal, and a first channel between the source and the drain having a first width and a first length. A programmable field-effect transistor circuit has a gate terminal connected to the input terminal, a drain terminal connected to the output terminal, a source terminal connected to a second power supply terminal, and a second channel circuit between the drain terminal and the source terminal having an effective width and an effective length. Programmable input terminals are connected to the second channel circuit for changing the ratio of the product of the first width times the effective length to the product of the effective width times the first length such that the input threshold voltage of the CMOS circuit is changed responsive to the change of the ratio. By programming the input terminals and selecting the voltages on the first and second power supply terminals, a universal input buffer for conversion of one logic level voltage to another may be provided.

6 Claims, 3 Drawing Sheets

CMOS CIRCUIT WITH PROGRAMMABLE INPUT THRESHOLD

BACKGROUND OF THE INVENTION

The present invention relates to the threshold of a circuit, and is more particularly related to a circuit in which its threshold may be programmed to be one of several values, as desired.

U.S. Pat. No. 3,449,594 to J. J. Gibson et al. issued June 10, 1969 for "Logic Circuits Employing Complementary Pairs of Field-Effect Transistors" discloses gate circuits having two conduction paths, each conduction path including two field-effect transistors of different conductively types having their source-to-drain channels connected in series.

U.S. Pat. No. 3,900,742 to Hampel et al. issued Aug. 19, 1975 for "Threshold Logic Using Complementary MOS Device" discloses gating circuits having threshold gates which are implemented by CMOS devices.

U.S. Pat. No, 4,217,502 to Suzuki et al. issued Aug. 12, 1980 for "Converter Producing Three Output States" discloses various circuits having field-effect transistors in series-parallel combinations.

U.S. Pat. No. 4,438,352 to Mardkha issued Mar. 20, 1984 for "TTL Compatible CMOS Input Buffer" discloses a TTL compatible CMOS input buffer which is accomplished by changing the input high voltage and by changing the drive of the n or p channel transistors or the width of the n channel transistor.

U.S. Pat. No. 4,555,642 to Morales issued Nov. 26, 1985 for "Low Power CMOS Input Buffer Circuit" discloses a low power CMOS input buffer circuit for use with a TTL level input. An additional input buffer "dummy" is included to sense and compare the input voltage to CMOS logic levels, and to compensate the input voltage if needed.

Other patents of interest include: U.S. Pat. No. 4,471,242 to Noufer et al. issued Sept. 11, 1984 for "TTL to CMOS Input Buffer"; U.S. Pat. No. 4,518,873 to Suzuki et al. issued May 21, 1985 for "Buffer Circuit for Driving a C-MOS Inverter"; U.S. Pat. No. 4,533,841 to Konishi issued Aug. 6, 1985 for "MOS Logic Circuit Responsive to an Irreversible Control Voltage for Permanently Varying its Signal Transfer Characteristic"; U.S. Pat. No. 4,578,600 to Magee issued Mar. 25, 1986 for "CMOS Buffer Circuit"; U.S. Pat. No. 4,584,491 to Ulmer issued Apr. 22, 1986 for "TTL to CMOS Input Buffer circuit for Minimizing Power Consumption"; and U.S. Pat. No. 4,593,212 to Svager issued June 3, 1986 for "TTL to CMOS Input Buffer".

SUMMARY OF THE INVENTION

In a specific embodiment, a CMOS circuit having an input threshold voltage includes an input terminal, an output terminal, a first power supply terminal, a second power supply terminal, a first field-effect transistor having a source connected to the first power supply terminal, a drain connected to the output terminal, a gate connected to the input terminal, and a first channel between the source and the drain having a first width and a first length, and a programmable field-effect transistor circuit having a gate terminal connected to the input terminal, a drain terminal connected to the output terminal, a source terminal connected to the second power supply terminal, and a second channel circuit between the drain terminal and the source terminal having an effective width and an effective length. Programmable input terminals are connected to the second channel circuit for changing the ratio of the product of the first width times the effective length to the product of the effective width times the first length such that the input threshold voltage of the CMOS circuit is changed responsive to the change of the ratio.

It is thus an object of the present invention to provide an improved CMOS circuit having a programmable input threshold.

It is another object of the present invention to provide a CMOS circuit which may be programmed for converting a first logic level to a second logic level.

It is another object of the present invention to provide a programmable CMOS circuit which may be programmed by supplying a specified combination of digitized signals to a register in the circuit.

These and other objects of the present invention will become apparent from the drawings and description of the preferred embodiments disclosed herein.

DESCRIPTION OF THE EMBODIMENTS

Figure 1:
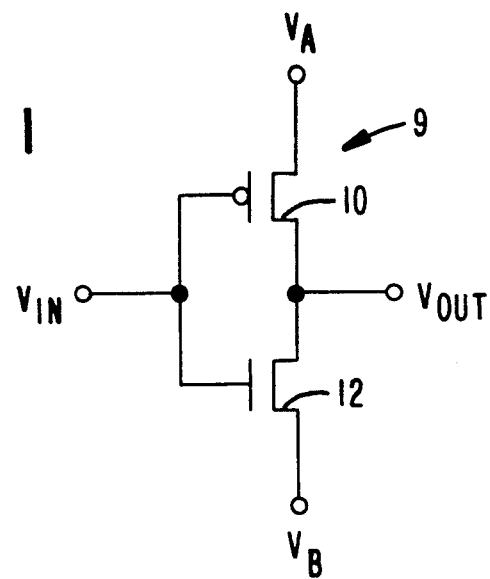
FIG. 1 is a schematic diagram of a prior art inverter circuit having a p channel transistor and an n channel transistor.

FIG. 1 is a circuit diagram of a CMOS inverter circuit 9 in which transistor 10 is a p channel transistor that is turned on when the voltage $V_{IN}$ is low in comparison with $V_A$, making the voltage $V_{OUT}$ high. Transistor 12 is an n channel transistor which is turned on when the voltage $V_{IN}$ is high in comparison to $V_B$, making the voltage $V_{OUT}$ low.

The following equation is a mathematical expression which defines the value of the threshold voltage ($V_{TH}$) of the inverter circuit 9 of FIG. 1.

$$V_{TH} = \frac{V_{AB} + V_{TP} + V_{TN}\left[\frac{K\,W_pL_n}{W_nL_p}\right]^{\frac{1}{2}}}{1 + \left[\frac{K\,W_pL_n}{W_nL_p}\right]^{\frac{1}{2}}}$$

Where:
 $V_{AB}$ = Power supply voltage between $V_A$ and $V_B$;
 $V_{TP}$ = Linear threshold voltage of the p channel device;
 $V_{TN}$ = Linear threshold voltage of the n channel device;
 $W_p$ = Width of the p channel device;
 $W_n$ = Width of the n channel device;
 $L_p$ = Length of the p channel device;

$L_n$ = Length of the n channel device; and $K = u_n/u_p$ = Ratio of the mobility of n to p materials.

Figure 2:
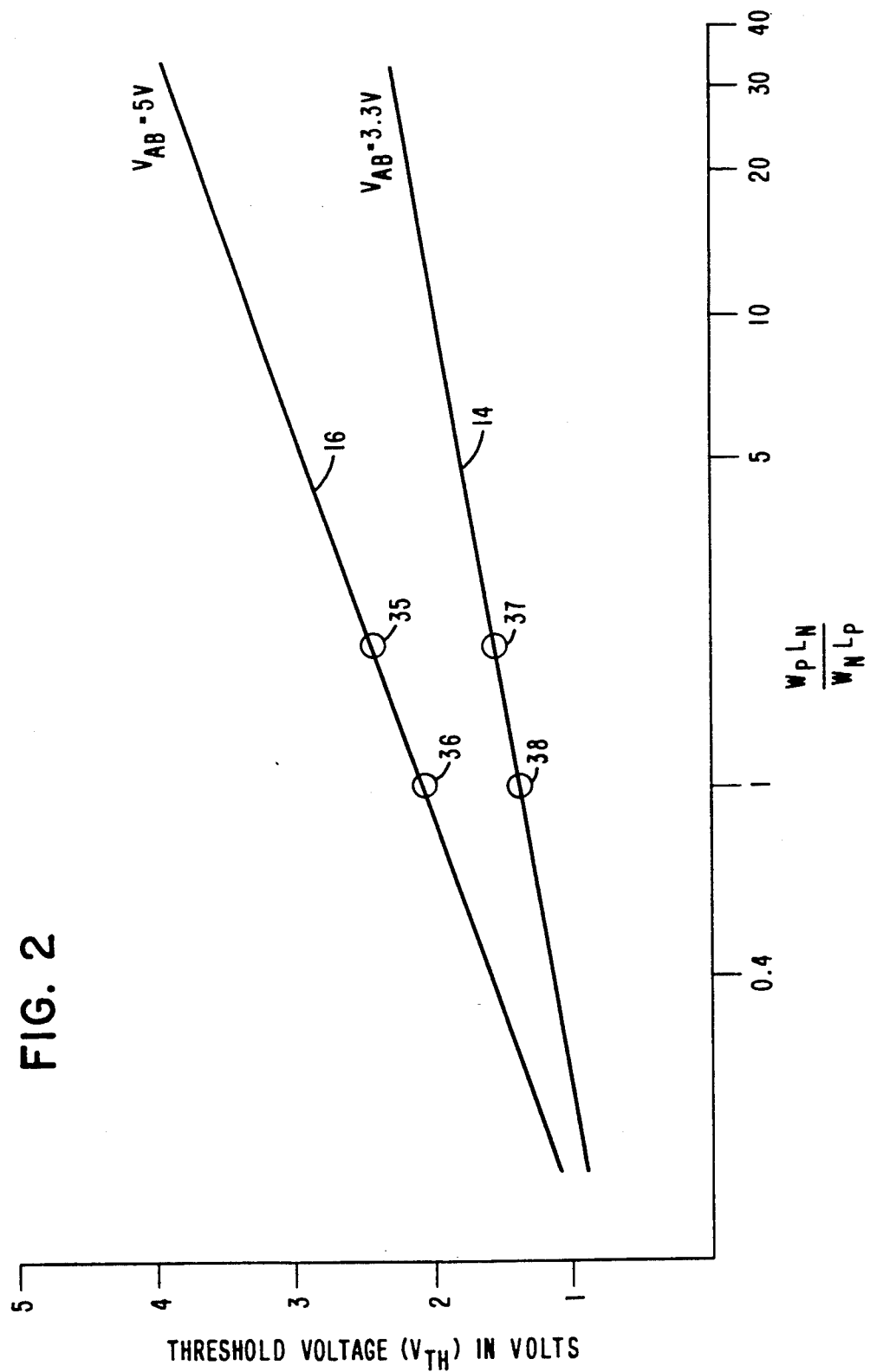
FIG. 2 is a plot of the value of the threshold voltage ($V_{TH}$) in volts versus the ratio ($W_pL_n/W_nL_p$) for two values of the power supply voltage between the terminals $V_A$ and $V_B$ of the circuit of FIG. 1.

FIG. 2 is a plot of the value of $V_{TH}$ in volts versus the ratio $(W_p L_n / W_n L_p)$ wherein the values of $V_{TP}$, $V_{TN}$, and K are constants. Line 14 is a curve wherein the value of $V_{AB}$ is held constant at 3.3 volts, and the ration $(W_p L_n / W_n L_p)$ is varied. The line 16 is a curve wherein the value of $V_{AB}$ is held constant at 5 volts, and the ration $(W_p L_n / W_n L_p)$ is varied. It will thus be seen that the threshold voltage $V_{TH}$ of the inverter circuit of FIG. 1 may be varied by varying the ratio of the widths and lengths of the transistors 10 and 12, or by varying the voltage $V_{AB}$, or both. In the present invention, the transistors 10 and 12 are comprised of multiple transistors which may be selectively placed in series-parallel combinations to vary the ratio $(W_p L_n / W_n L_p)$, as desired.

Figure 3:
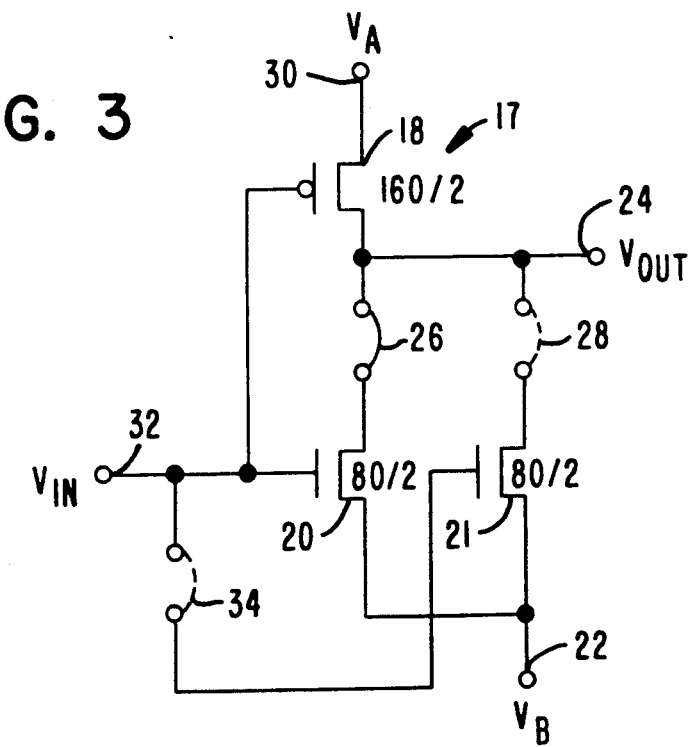
FIG. 3 is a schematic diagram of an inverter circuit of an embodiment of the present invention utilizing a pair of n channel transistors which may be connected in parallel by jumpers.

FIG. 3 is a circuit diagram of a CMOS inverter 17 having a p channel transistor 18, which is equivalent to the p channel transistor 10 of FIG. 1, and a pair of n channel transistors 20 and 21, which together are equivalent to the n transistor 12 of FIG. 1. The sources of the transistors 20 and 21 are connected to the terminal 22 on which is placed voltage $V_B$. The drains of the transistors 20 and 21 are connected to the output terminal 24 of the inverter circuit 17 via jumpers 26 and 28, respectively. The source of the p channel transistor 18 is connected to the terminal 30 on which is placed the voltage $V_A$, and its drain is connected to the output terminal 24. The gates of the transistors 18 and 20 are connected to the input terminal 32 which receives the input voltage $V_{IN}$. The gate of the transistor 21 is connected to the input terminal 32 via a jumper 34. The ratio of the width of the p channel transistor 18 to its length is 160/2, as shown in FIG. 3. The ratio of the width of each of the n channel transistors 20 and 21 to its length is 80/2. When the jumper 26 is in place and the jumpers 28 and 34 are removed, the inverter circuit 17 of FIG. 3 is the same as the inverter circuit 9 of FIG. 1. However, when the jumpers 26, 28 and 34 are in place, the transistors are in parallel, thus resulting in a changed threshold voltage for the inverter circuit 17.

When the transistor 21 is removed from the circuit by removing or disconnecting the jumpers 28 and 34, the ratio $(W_p L_n / W_n L_p)$ is equal to $(160 \times 2)/(80 \times 2) = 2$. Referring to FIG. 2, this value is found on line 16 at 35, making the threshold voltage of the inverter circuit 17 in this case about 2.4 volts when the voltage $V_{AB}$ is equal to 5 volts. When the jumpers 28 and 34 of FIG. 3 are connected, the ratio $(W_p L_n / W_n L_p)$ is equal to $(160 \times 2)/((80+80) \times 2) = 1$. This is found at 36 on line 16 of FIG. 2 wherein the threshold voltage of the inverter circuit 17 is about 2.1 volts. If the jumpers 28 and 34 are disconnected and the voltage $V_{AB}$ is held at 3.3 volts, the threshold voltage is about 1.55 volts (see 37 on line 14 of FIG. 2). If the jumpers 28 and 34 are connected and the voltage $V_{AB}$ is held at 3.3 volts, the threshold voltage is about 1.37 volts (see 38 on line 14 of FIG. 2).

Figure 4:
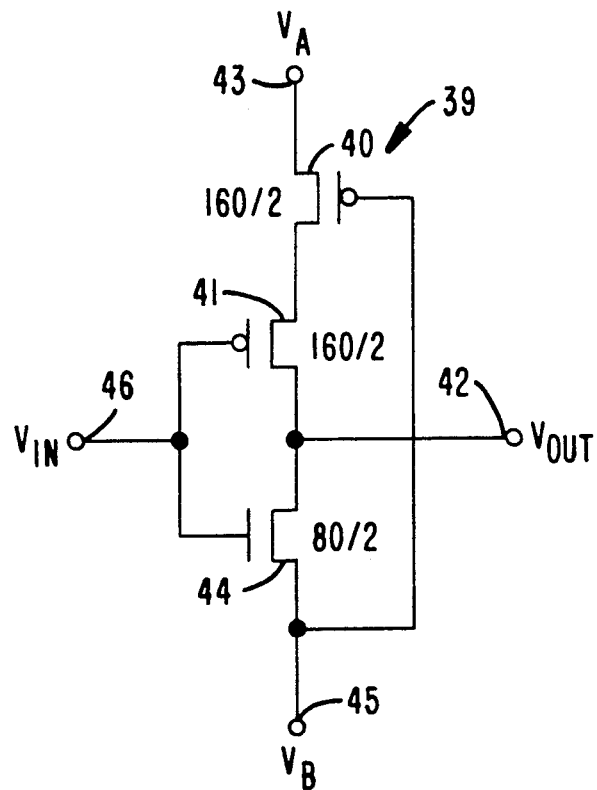
FIG. 4 is a schematic diagram of an inverter circuit wherein a pair of p channel transistors are connected in series.

FIG. 4 is a schematic diagram of an inverter circuit 39 having p channel transistors 40 and 41 in series. The source of the transistor 40 is connected to a $V_A$ terminal 43, and its drain is connected to the source of the transistor 41. The drain of the p channel transistor 41 is connected to a $V_{OUT}$ terminal 42. An n channel transistor 44 has its source connected to a $V_B$ terminal 45 and its drain connected to the $V_{OUT}$ terminal 42. The gates of the transistors 41 and 44 are connected to a $V_{IN}$ terminal 46. The gate of the p channel transistor 40 is connected to the $V_B$ terminal 45. The ratio of the width to the length of each of the p channel devices 40 and 41 is 160/2, and the ratio of the width to the length of the n channel device 44 is 80/2.

Thus, the effective ratio for the configuration of FIG. 4 is $(W_p L_n)/(W_n L_p) = (160 \times 2)/(80+80)2 = 1$. Referring to FIG. 2, when the voltage $V_{AB}$ of the circuit of FIG. 4 is held at 5.0 volts, the threshold voltage $V_{TH}$ for the inverter circuit 39 is about 2.1 volts (36 on line 16), and when the voltage $V_{AB}$ is held at 3.3 volts, the threshold voltage $V_{TH}$ is about 1.37 volts (38 on line 4). It will thus be understood that the threshold voltage of an inverter circuit can readily be adjusted by arranging its transistors in parallel (FIG. 3), by arranging its transistors in series (FIG. 4), and/or by changing its power supply voltage $V_{AB}$.

Figure 5:
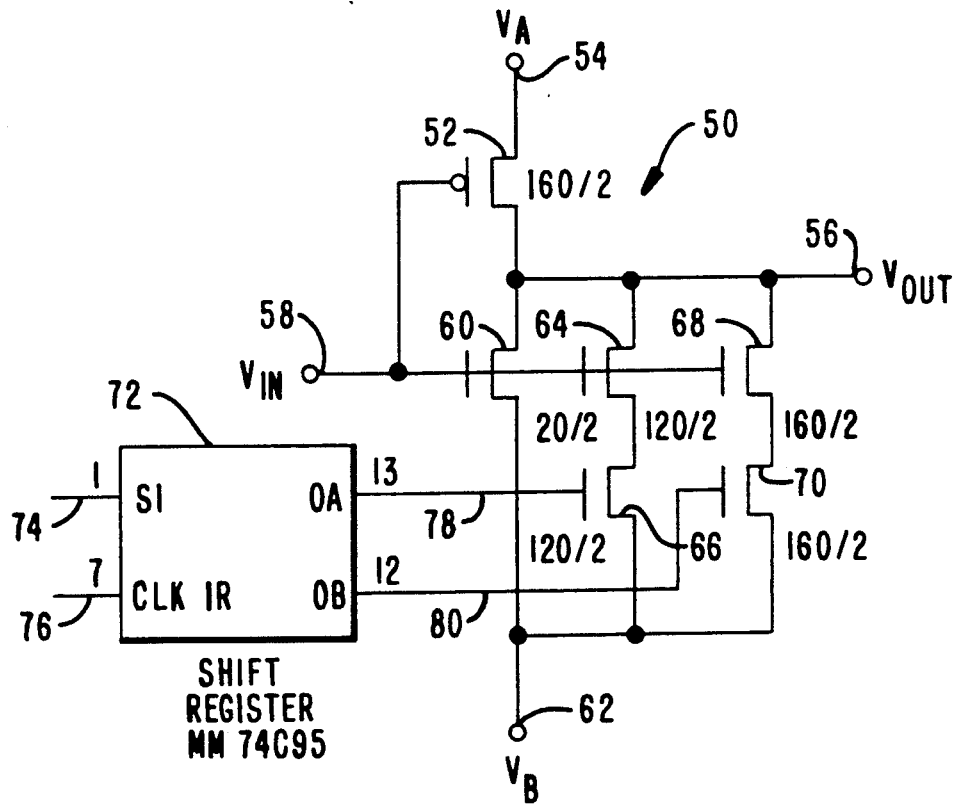
FIG. 5 is a schematic diagram of the circuit of the preferred embodiment of the present invention having a programmable input threshold.

FIG. 5 is a schematic diagram of an inverter circuit 50 of preferred embodiment of the present invention having a p channel transistor 52 with its source connected to a $V_A$ terminal 54 and its drain connected to a $V_{OUT}$ terminal 56. The gate of the p channel transistor 52 is connected to a $V_{IN}$ terminal 58. An n channel transistor 60 has its source connected to a $V_B$ terminal 62 and its drain connected to the $V_{OUT}$ terminal 56. A first pair of n channel transistors 64 and 66 are connected in series with the source of transistor 66 connected to the $V_B$ terminal 62, the drain of the transistor 66 connected to the source of the transistor 64, and the drain of the transistor 64 connected to the $V_{OUT}$ terminal 56. A second pair of n channel transistors 68 and 70 are connected in series with the source of transistor 70 connected to the $V_B$ terminal 62, the drain of the transistor 70 connected to the source of the transistor 68, and the drain of the transistor 68 connected to the $V_{OUT}$ terminal 56. The gates of the transistors 60, 64 and 68 are connected to the $V_{IN}$ terminal 58.

A shift register 72, which may be an MM74C95 device from National Semiconductor, has a serial input 74 connected to pin 1 for receiving serial data bits, a clock input 76 connected to pin 7 for clocking data bits into the shift register 72, and outputs 78 and 80 connected between pin 13 and the gate of transistor 66 and between pin 12 and the gate of the transistor 70, respectively. Thus, data bits may be shifted into the shift register 72 to turn on the transistors 66 or 70 thereby arranging the transistors 60, 64, 66, 68 and 70 in the desired series/parallel circuit such that the $(W_p L_n / W_n L_p)$ ratio of the inverter circuit 50 is at the desired level.

The inverter circuit 50 of FIG. 5 is programmable in that when the output on pin 13 ($O_A$) of the shift register 70 is high, the transistor 66 is enabled and the series transistors 64 and 66 are placed in parallel with the transistor 60. When the output on pin 12 ($O_B$) of the shift register 72 is high, the transistor 70 is enabled and the series transistors 68 and 70 are placed in parallel with the transistor 60.

The following table shows programmed variations of the circuit 50 for providing interfaces between emitter coupled logic (ECL), normal complementary metal oxide silicon (CMOS) logic, and/or transistor-to-transistor logic (TTL).

| $V_A$ | $V_B$ | $O_A$ | $O_B$ | **$V_{IN}$ | *$V_{OUT}$*** | $V_{TH}$ | LOGIC |
|---|---|---|---|---|---|---|---|
| 0.0 | −3.3 | −3.3 | −3.3 | −1.6 to −0.8 | −3.3 to 0.0 | −1.3 | ECL-CMOS |
| 3.3 | 0.0 | 3.3 | 3.3 | 0.0 to 2.0 | 0.0 to 3.3 | 1.4 | TTL-CMOS |
| 3.3 | 0.0 | 3.3 | 0.0 | 0.0 to 3.3 | 0.0 to 3.3 | 1.65 | CMOS-CMOS |
| 5.0 | 0.0 | 5.0 | 0.0 | 0.0 to 5.0 | 0.0 to 5.0 | 2.5 | CMOS-CMOS |
| 1.4 | −2.2 | −2.2 | −2.2 | 0.4 to −0.4 | −2.2 to 1.4 | 0.0 | IBM ECL-CMOS |

Other devices may be used to provide enabling voltages to the gates of transistors 66 and 70. For instance a counter, such as an MM74C93 device from National Semiconductor, may be used and the desired gate enabled by providing a desired number of pulses to the counter. Also, electrically alterable devices, for example EEPROMS, programmable memory logic devices, or fusable link devices, may be used in place of the shift register 72. The mentioned devices may be CMOS devices which are formed on a chip with the inverter circuit 50, either alone or with other devices, to provide a programmable interface between the circuit on the chip and other devices external to the chip. Any of such devices are referred to herein as a register. Various parallel and series combinations may also be used other than the combinations shown in FIG. 5. Additionally, the input structure may also be applied to other logic devices such as NOR or NAND structures.

Thus, various circuits have been described which provide the aforementioned objects. It will be understood by those skilled in the art that the disclosed embodiments are exemplary only, and that the various elements disclosed herein may be replaced by equivalents hereof, which equivalents are covered by the appended claims.

What is claimed is:

1. A CMOS circuit having an input threshold voltage, said CMOS circuit comprising:
    an input terminal;
    an output terminal;
    a first power supply terminal;
    a second power supply terminal;
    first field-effect transistor means having a source connected to said first power supply terminal, a drain connected to said output terminal, a gate connected to said input terminal, and a first channel means between said source and said drain having a first width and a first length;
    programmable field-effect transistor means having a gate terminal connected to said input terminal, a drain terminal connected to said output terminal, a source terminal connected to said second power supply terminal, second channel means between said drain terminal and said source terminal, said second channel means having an effective width and an effective length; and
    programmable input means connected to said second channel means for changing the ration of the product of said first width times said effective length to the product of said effective width times said first length said that the input threshold voltage of said CMOS circuit is changed responsive to the change of said ratio;
    wherein said second channel means includes a plurality of field-effect transistors connected in a series/parallel circuit; and
    wherein said programmable input means include gate terminal means connected to the gates of selected ones of said plurality of field-effect transistors such that said selected ones of said plurality of field-effect transistors may be turned on and off by electric signals applied to said gate terminal means.

2. The CMOS circuit of claim 1 further including register means for storing electrical signals, said register means having output means connected to said gate terminal means such that electrical signals may be applied via said gate terminal means to the gates of selected ones of said plurality of field-effect transistors.

3. The CMOS circuit of claim 2 wherein said first field-effect transistor means is a p channel device, and wherein said plurality of field-effect transistors of said second channel means are n channel devices.

4. The CMOS circuit of claim 3 wherein said second channel means comprises:
    a first n channel device having a source connected to said second power supply terminal, a drain connected to said output terminal and a gate connected to said input terminal;
    second and third n channel devices connected in series;
    said second n channel device having a drain connected to said output terminal, a gate connected to said input terminal, and a source; and
    said third n channel device having a drain connected to the source of said second n channel device, a gate connected to said gate terminal means, and a source connected to said second power supply terminal such that a first programmed electrical signal from said gate means to the gate of said third n channel device turns on said third n channel device changing the effective width and length of said channel means.

5. The CMOS circuit of claim 4 wherein said second channel means further comprises:
    fourth and fifth n channel devices connected in series;
    said fourth n channel device having a drain connected to said output terminal, a gate connected to said input terminal, and a source; and
    said fifth n channel device having a drain connected to the source of said third n channel device, a gate connected to said gate terminal means, and a source connected to said second power supply terminal such that a second programmed electrical signal from said gate means to the gate of said fifth n channel device turns on said fifth n channel device changing the effective width and length of said channel means.

6. A CMOS circuit having an input threshold voltage, said CMOS circuit comprising:
    an input terminal;
    an output terminal;
    a first power supply terminal;
    a second power supply terminal;
    first field-effect transistor means having a source connected to said first power supply terminal, a drain connected to said output terminal, a gate connected to said input terminal, and a first channel means between said source and said drain having a first width and a first length;

programmable field-effect transistor means having a gate terminal connected to said input terminal, a drain terminal connected to said output terminal, a source terminal connected to said second power supply terminal, second channel means between said drain terminal and said source terminal, said second channel means having an effective width and an effective length; and programmable input means connected to said second channel means for changing the ratio of the product of said first width times said effective length to the product of said effective width times said first length such that the input threshold voltage of said CMOS circuit is changed responsive to the change of said ratio;

wherein said first field-effect transistor means is a p channel device;

said second channel means comprises a first n channel device having a source connected to said second power supply terminal, a gate connected to said input terminal, and a drain connected to said output terminal;

a second n channel device having a source connected to said second power supply terminal, a gate, and a drain; and said programmable input means comprises a first jumper means connected between the drain of second n channel device and said output terminal and a second jumper means connected between the gate of said n channel device and said input terminal such that said second n channel device is included in said second channel means parallel to said first n channel device by said first and second jumper means.

* * * * *

UNITED STATES PATENT AND TRADEMARK OFFICE
CERTIFICATE OF CORRECTION

PATENT NO. : 5,059,835

DATED : October 22, 1991

INVENTOR(S) : Donald K. Lauffer, et al.

It is certified that error appears in the above-identified patent and that said Letters Patent is hereby corrected as shown below:

Column 5, line 56, delete "ration" and insert --ratio--.

Column 5, line 59, delete "said" first occurrence and insert --such--.

Signed and Sealed this

Ninth Day of March, 1993

Attest:

STEPHEN G. KUNIN

Attesting Officer

Acting Commissioner of Patents and Trademarks